United States Patent [19]

Pilost

[11] Patent Number: 4,553,128

[45] Date of Patent: Nov. 12, 1985

[54] ANALOG-TO-DIGITAL CONVERTER

[75] Inventor: Daniel Pilost, LaGaude, France

[73] Assignee: International Business Machines Corp., Armonk, N.Y.

[21] Appl. No.: 555,313

[22] Filed: Nov. 25, 1983

[30] Foreign Application Priority Data

Dec. 28, 1982 [EP] European Pat. Off. ........ 82430046.1

[51] Int. Cl.⁴ ............................................ H03K 13/02
[52] U.S. Cl. .............................. 340/347 AD; 328/162; 375/28
[58] Field of Search ................. 340/347 AD, 347 CC; 328/162; 375/28

[56] References Cited

U.S. PATENT DOCUMENTS

| | | | |
|---|---|---|---|
| 3,982,241 | 9/1976 | Lipcon | 340/347 AD |
| 3,999,129 | 12/1976 | Kasson | 340/347 AD |
| 4,224,605 | 9/1980 | Michaud et al. | 340/347 AD |
| 4,251,803 | 2/1981 | Debord et al. | 340/347 AD |
| 4,380,005 | 4/1983 | Debord et al. | 340/347 AD |

Primary Examiner—B. Dobeck
Attorney, Agent, or Firm—John B. Frisone

[57] ABSTRACT

This analog-to-digital converter includes a comparator (20) to which the samples $X_{(n)}$ of the signal to be converted, are applied. The output of the comparator controls a logic circuit (22) producing (N+1) bits to a digital-to-analog converter (24) the output of which is fed back to the input of comparator (20). The converter carries out a converting procedure through N successive approximation steps at the end of which the N most significant bits available at the output of the logic circuit (22) stand directly for the rounded-off digital value of sample $X_{(n)}$.

3 Claims, 5 Drawing Figures

ANALOG-TO-DIGITAL CONVERTER

DESCRIPTION

This invention relates to electrical signal conversion wherein a signal is converted from an analog representation into a digital representation and, more specifically, into a rounded-off digital value.

The modem (modulator/demodulator) receivers are comprised of microprocessors which digitally process the received signal, to derive therefrom the received digital data. Since the signal at the input of the modem receiver, is in the analog form, it must be digitally converted before its being processed by the microprocessors. Such a conversion is carried out by inserting an analog-to-digital converter (ADC) between the receiver input and the input of that portion of the microprocessor which is in charge of the digital processing operations of the received signal.

When the digital processing operation is carried out on N-bit words, the ADC converter, generally, is conceived in order to supply (N+1) bit words which, then, are rounded off to N-bit words. Such an operation, the so-called round-off process, generally, is carried out by the signal processor. To this end, digital value $+\frac{1}{2}$ is added to each (N+1) bit word supplied by the ADC converter. The result of such an operation is truncated to N-bits.

All these operations, of course, must be carried out within a lapse of time all the shorter as the modem is operating at a high rate. The received analog signal, indeed, must be sampled at a frequency which is correlated with the modem operating rate. Then, the conversion of each sample, into the digital form, must be carried out and terminated before the following sample occurs. Now, the round-off process carried out by the signal microprocessor, that is to say, out of the converter ADC, proper, includes several successive steps. First, converter ADC sends an interrupt request, to the microprocessor. For a high rate-operated modem, it is not rare, because of the load of work incumbent on the microprocessor which has to deal with all the signal processing operations, proper, that an interrupt request cannot be satisfied before 2 microseconds (µs) following its formulation. Thereupon, the microprocessor will have less than 20 µs left to process the interrupt request, i.e., to carry out the so-called round-off operations which include: adding $+\frac{1}{2}$ to the (N+1) bit digital value of the signal sample supplied by the ADC convert; checking the overflow; then, truncating the result of the addition to N-bit words.

Consequently, using an analog-to-digital converter which could carry out itself the round-off operations, would release the microprocessor from some operations. The latter would have about 20 µs more to process each signal sample.

The object of this invention is to provide for an analog-to-digital converter supplying rounded-off digital values.

The foregoing and other objects, features and advantages of the invention will be apparent from the following more particular description of a preferred embodiment of the invention, as illustrated in the accompanying drawings.

Figure 1:
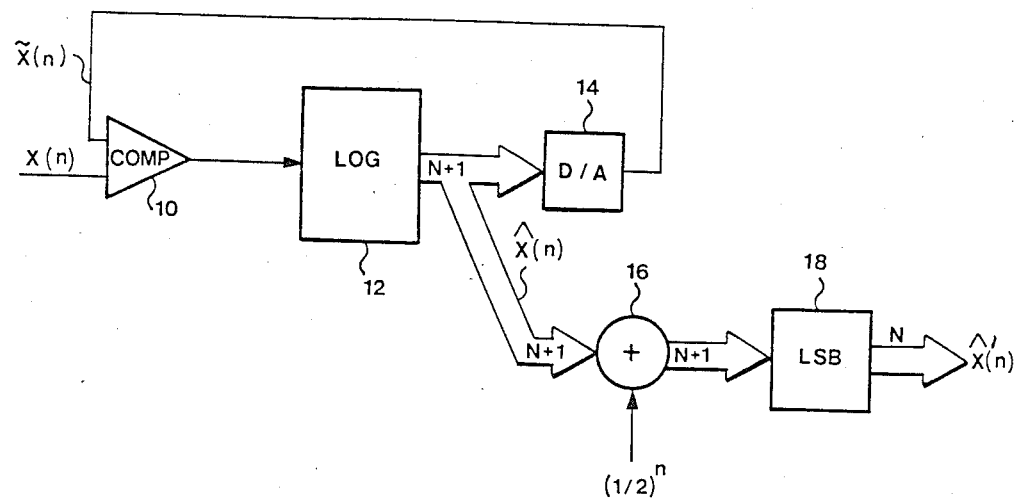
FIG. 1, is a schematic block diagram of a conventional means involved in the implementation of the round-off analog-digital converting function.

There is shown in FIG. 1 a schematic block diagram summarizing the conventional operations involved in the conversion of an analog signal into rounded-off digital values. Sample $X_{(n)}$ (n being indicative of the rank of the sample in the received sample stream) of the signal to be digitally converted, is applied to comparator 10. The comparator 10 output controls a logic device 12. Device 12 supplies (N+1) bits which are representative of an approximative digital value of sample $X_{(n)}$. Such a value is converted again into an analog value in converter D/A 14 before being reintroduced into comparator 10. The assembly comprised of elements 10, 12 and 14 tends, upon successive approximations, to reduce the discrepancy between the two inputs of comparator 10, i.e., to translate $X_{(n)}$ into a digital value $\hat{X}_{(n)}$ as precise as possible and comprised of (N+1) bits. An element the digital value of which is equal to $(\frac{1}{2})^N$ is added to value $\hat{X}_{(n)}$, in adder 16. The result of this addition, then, is supplied to device 18 which removes the least significant bit (LSB), thereby producing a rounded-off N bit value $\hat{X}'_{(n)}$.

It should be noted that the above-disclosed device has a few drawbacks. More specifically, the iteration for supplying the (N+1) bit encoded element $\hat{X}_{(n)}$ includes (N+1) steps.

Besides, the round-off operations require either additional circuis or additional processing power within a microprocessor.

The purpose, here, is a converter having not such drawbacks, owing to a direct search of the rounded-off result.

It will, first, be supposed that the result should be expressed in a geometric progression with a base equal to $\frac{1}{2}$ and including (N+1) elements. Therefore, there can be written:

$$X_{(n)} \approx \frac{V_M}{2} [ - k_0 + k_1(\tfrac{1}{2}) + k_2(\tfrac{1}{2})^2 + \ldots + \quad (1)$$

$$k_{(N-1)}(\tfrac{1}{2})^{N-1} + k_N(\tfrac{1}{2})^N ]$$

where
$k_i = 0$ or 1 for $i = 0, 1, \ldots, N$ and
$V_M$ is representative of the maximum analog value of the sample to be measured.

Series $k_0, k_1, \ldots, k_N$ is representative of (N+1) bits in the encoded sample $\hat{X}_{(n)}$, when not considering the coding errors.

When wishing to round-off the result with an excess of $(\frac{1}{2})^N$, this comes to add $(V_M 2/)(\frac{1}{2})^N$ to analog value $X_{(n)}$ to be measured, at the right beginning of the process. Whence, an element $X'_{(n)} = X_n + V_M/2.(\frac{1}{2})^N$.

The dichotomous approach, therefore, can be applied to element $X'_{(n)}$ which leads, through successive approximations, to determine the coefficients $k_i$ in expression (1). Therefore, there will be obtained:

$$X_{(n)}' \approx \frac{V_M}{2} [ - k_0' + k_1'(\tfrac{1}{2}) + \ldots + \quad (2)$$

-continued $$k_{(N-1)}(\tfrac{1}{2})^{N-1}]$$

Elements $k'_i$ for $i=0$ through $(N-1)$ are representative of the N searched bits.

Table I is a table for two's complement coded with 5 bits wherein the least significant bit has for a weight $\tfrac{1}{2}$.

TABLE I

| Sign | (−8) | 4 | 2 | 1 | $\tfrac{1}{2}$ |
|---|---|---|---|---|---|
| +V$_M$ | 0 | 1 | 1 | 1 | 1 |
|  | 0 | 1 | 1 | 1 | 0 |
|  | 0 | 1 | 1 | 0 | 1 |
|  | 0 | 1 | 1 | 0 | 0 |
|  | 0 | 1 | 0 | 1 | 1 |
|  | 0 | 1 | 0 | 1 | 0 |
|  | 0 | 1 | 0 | 0 | 1 |
|  | 0 | 1 | 0 | 0 | 1 |
|  | 0 | 0 | 1 | 1 | 1 |
|  | 0 | 0 | 1 | 1 | 0 |
|  | 0 | 1 | 0 | 1 | 1 |
|  | 0 | 0 | 1 | 0 | 0 |
|  | 0 | 0 | 0 | 1 | 1 |
|  | 0 | 0 | 0 | 1 | 0 |
| 0 | 0 | 0 | 0 | 0 | 1 |
|  | 0 | 0 | 0 | 0 | 0 |
| ε | 1 | 1 | 1 | 1 | 1 |
|  | 1 | 1 | 1 | 1 | 1 |
|  | 1 | 1 | 1 | 0 | 1 |
|  | 1 | 1 | 1 | 0 | 0 |
|  | 1 | 1 | 0 | 1 | 1 |
|  | 1 | 1 | 0 | 1 | 0 |
|  | 1 | 1 | 0 | 0 | 1 |
|  | 1 | 1 | 0 | 0 | 0 |
|  | 1 | 0 | 1 | 1 | 1 |
|  | 1 | 0 | 1 | 1 | 0 |
|  | 1 | 0 | 1 | 0 | 1 |
|  | 1 | 0 | 1 | 0 | 0 |
|  | 1 | 0 | 0 | 1 | 1 |
|  | 1 | 0 | 0 | 1 | 0 |
|  | 1 | 0 | 0 | 0 | 1 |
|  | 1 | 0 | 0 | 0 | 0 |
| −V$_M$ |  |  |  |  |  |

It should be noted that, owing to such a table, it is not necessary to provide for additional means for adding value $(V_M/2)(\tfrac{1}{2})^N$ to the input sample. It suffices, indeed, to keep $(N+1)$ bits at the input of D/A converter 14. Once the dichotomous approach is terminated, the N most significant bits (MBS) are to be kept in the obtained result, which leads to the schematic block diagram of FIG. 2.

The sample $X_{(n)}$ is fed into the input of comparator 20. The output of such a comparator controls a logic device LOG 22 operating on $(N+1)$ bits. The $(N+1)$ bits supplied by logic device 22 are fed into a D/A converter 24 which is, itself, operating upon $(N+1)$ bits and feeding the second input of the comparator. Once the dichotomous approach is terminated, (N steps are sufficient), only the N most significant bits will be kept to express the searched rounded-off elements $\hat{X}'_{(n)}$.

Figure 3:
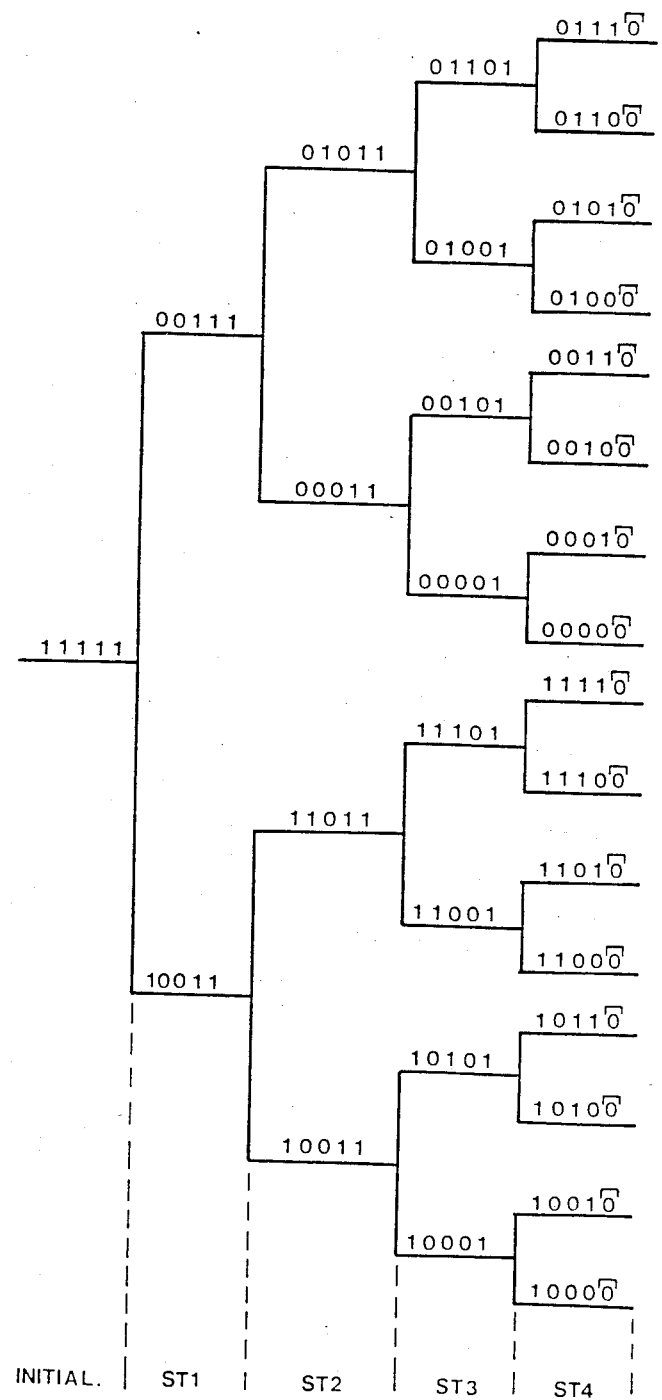
FIG. 3, is a scheme of the dichotomous encoding approach of this invention.

FIG. 3 is a scheme of the dichotomous encoding approach involved in logic device 22.

Figure 2:
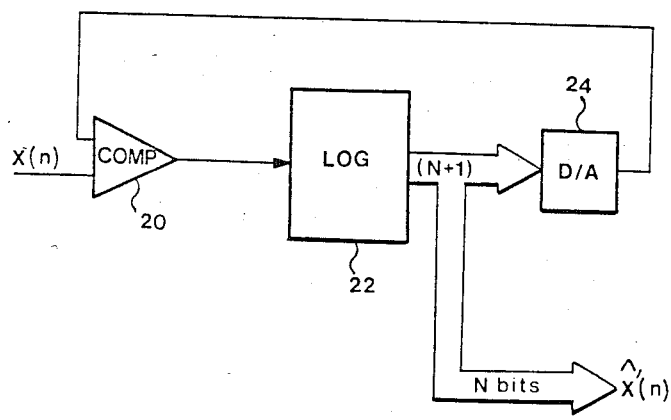
FIG. 2, is a schematic block diagram of this invention.

When a sample $X_{(n)}$ starts being processed, the device of FIG. 2 is initiated by forcing the $(N+1)$ bits provided by the logic device 22 to "1". Such a value is converted into an analog form by converter D/A 24 and is fed back into the input of comparator 20. According as the result of the comparison in comparator 20 is positive or negative, the most significant bit is forced to "0" or "1", like in a conventional method. But, together with this operation, logic device 22 forces to "0" the bit located to the right of the most significant bit. The comparison carried out in device 20 is resumed with this new $(N+1)$ bit encoded value of $\hat{X}_{(n)}$. The result of the comparison is used to define conditionally that bit which has been previously forced to "0", whereas that bit which is immediately on its right, is forced to "0", and so on. It can be stated, then, that the N bit rounded-off digital value of the coded sample $\hat{X}_{(n)}$ has been determined in N cycles, in comparator 20. In brief, in the encoding process for encoding a sample $X_{(n)}$ into a rounded-off coded value expressed in two's complement, all the bits of a $(N+1)$ bit word, are, first, forced to "1". Then, in a first step of an iterative process, an analog representation of this $(N+1)$ bit word is compared with the sample $X_{(n)}$ so as to determine conditionally the binary value to be allocated to the most significant bit (the leftmost bit) in the $(N+1)$ bit word. That bit which is immediately on the right of the conditionally determined bit, is forced to "0" in an unconditional manner. A new $(N+1)$ bit word, therefore, is obtained, upon which the iterative process is operated again (second step), which step starts with a comparison of the new $(N+1)$ bit encoded word, with $X_{(n)}$. The result of this comparison is used to define conditionally the binary value to be given to the bit previously forced to "0", whereas that bit which is immediately on its right, is unconditionally forced to "0", and so on, through N steps. The final searched rounded-off result, namely $\hat{X}'_{(n)}$, is obtained by preserving, after the Nth step, the N most significant bits in the so-determined $(N+1)$ bit word.

Figure 4:
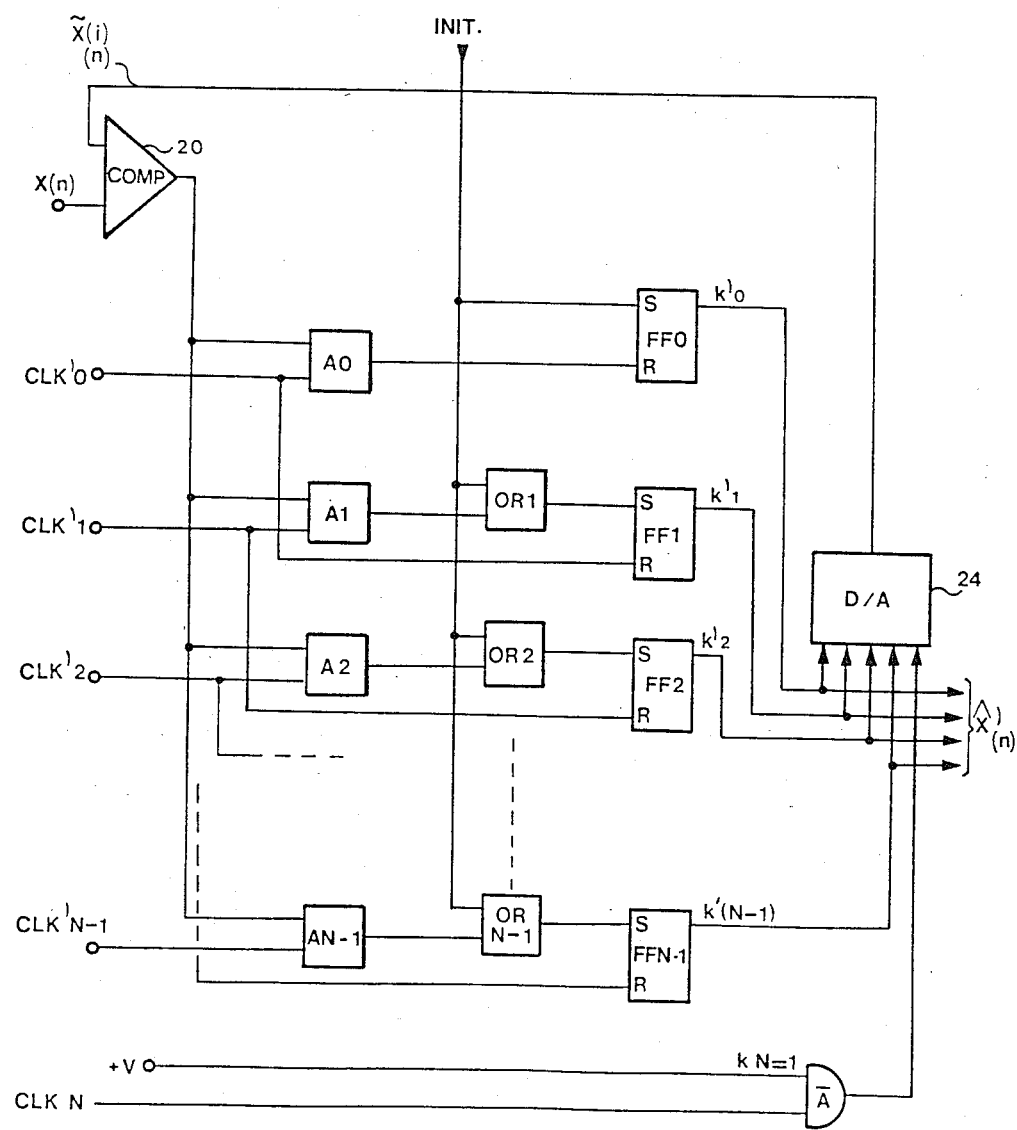
FIG. 4, is an embodiment of the coder according to this invention.

FIG. 4 is an embodiment of the ADC encoder according to this invention which illustrates in details the operation of logic device 22. The output of comparator 20 is connected to one of the inputs of N AND circuits $A_0, A_1, \ldots, A_{N-1}$. The second inputs of AND circuits $A_0$ through $A_{N-1}$, the so-called clock inputs and designated by $CLK'_0, CLK'_1, \ldots, CLK'_{N-1}$ are scanned from top to bottom by a clock pulse. The output of circuit $A_0$ is connected to the reset input (R) of a flip-flop $FF_0$, the sign flip-flop. The set input (S) of flip-flop $FF_0$ is connected to an initiating line INIT. This line is also connected to one of the inputs of a set of OR logic circuits $OR_1, OR_2, \ldots OR_{N-1}$. The second input of each of these OR circuits is connected to the output of one of the AND circuits $A_1$ through $A_{N-1}$. The output of each of these OR circuits $OR_1$ through $OR_{N-1}$ is connected to the input(s) of the flip-flop circuits $FF_1$, $FF_2, \ldots FF_{N-1}$. The reset inputs of flip-flop circuit $FF_1$ through $FF_{N-1}$ are connected to inputs $CLK'_0$ through $CLK'_{N-2}$, respectively. Finally, a direct line is connected to a voltage source $+V$ so as to supply a bit equal to "1" (bit kN, of binary word $\hat{X}_{(n)}$, in a permanent manner. The normal logic outputs of flip-flop circuits $FF_0$ through $FF_{N-1}$ as well as line $k_N=1$ which is maintained to logic level 1, in a permanent manner, are connected to the inputs of the D/A converter 24 the output of which is connected to one of the two inputs of the comparator 20. The set of flip-flop circuits ($FF_0$, $FF_1, \ldots, FF_{N-1}$) comprises the output register (ADC REG) of the analog-to-digital converter according to this invention. This register is intended to contain the N significant bits looked for. Said N bits, more particularly, include the so-called sign bit in flip-flop $FF_0$. During the successive approximation converting process, the N most significant bits in each $(N+1)$ bit rounded-off value, will be stored in the output register.

Figure 5:
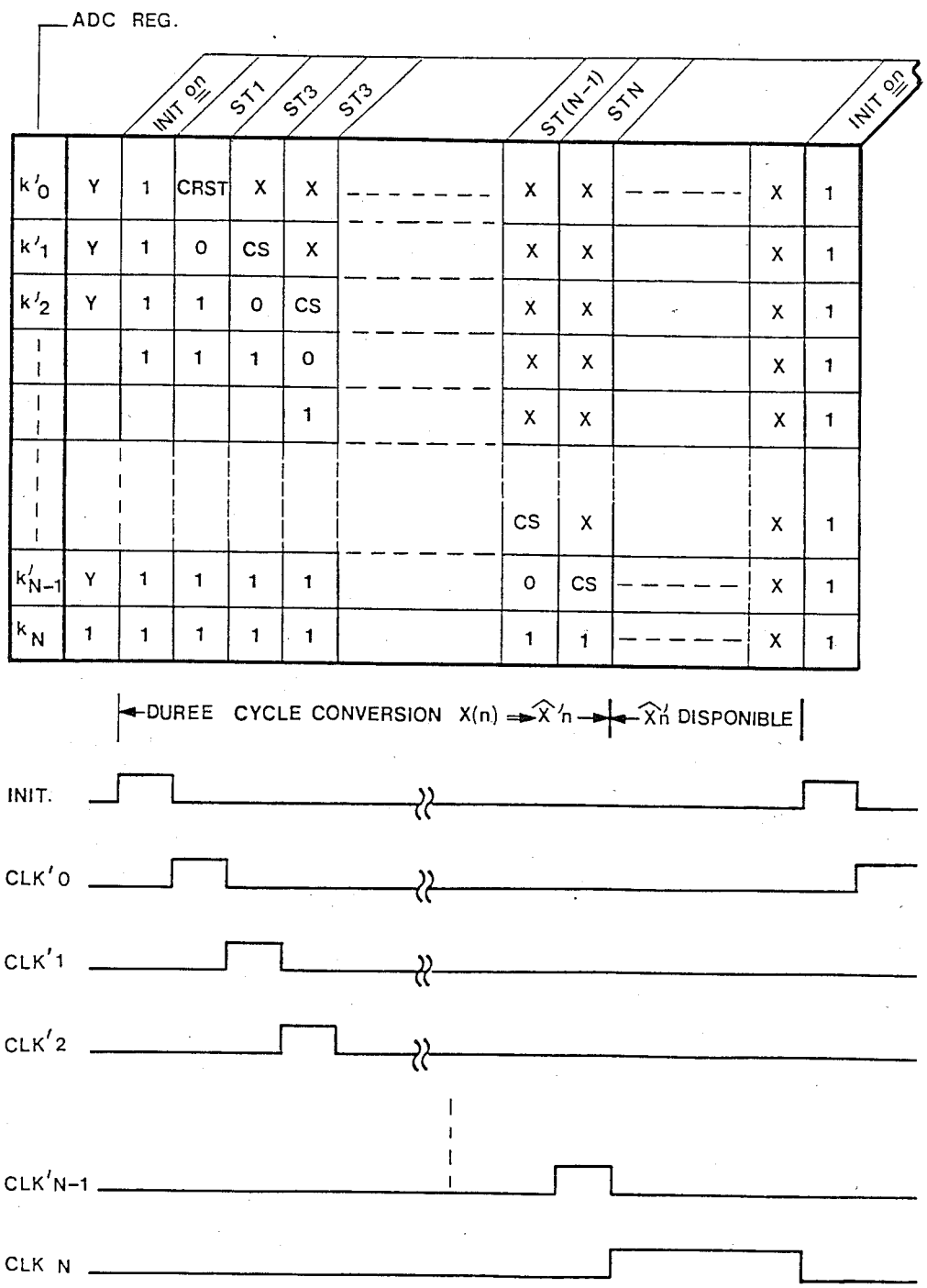
FIG. 5 is a diagram illustrating the converting procedure of this invention, in terms of time.

FIG. 5 is a diagram illustrating the progression of the conversion process in terms of time. The first column (the leftmost column) illustrates the different stages of the output register (ADC REG.) and stage $k_N$ which does not belong to the output register of the converter. It is assumed that initially each of the output register stages is in an undetermined state (Y). The converting operation for sample $S_{(n)}$ starts when the initiating pulse INIT occurs, which loads a bit "1" into each of the stages of register ADC REG. The input of converter 24, therefore, receives a (N+1) bit long word $\hat{X}_{(n)}^{(1)}$, wherein the bits are all equal to "1". The reconstituted analog value of this word, namely $\bar{X}_{(n)}^{(1)}$, is applied to the input of comparator 20. As soon as clock pulse $CLK'_0$ is applied to the input of AND gate $A_0$, the first step $(ST_1)$ of a conversion cycle starts in the ADC converter. Such a pulse resets unconditionally the flip-flop $FF_1$, in other words, forces $k'_1$ to "0". In addition, according as the discrepancy between $\bar{X}_{(n)}^{(1)}$ and $X_{(n)}$ is positive or negative, the output of comparator 20 will be brought to "1" or to "0". When the output of the comparator is "1", flip-flop $FF_0$ is reset, which corresponds to a conditional reset (CRST).

The input of the D/A converter 24, then, receives a (N+1) bit word, namely, value $\hat{X}_{(n)}^{(2)}$ which is representative of a first (N+1) bit approximation of the encoded value of $X_{(n)}$. The corresponding analog value $\bar{X}_{(n)}^{(2)}$ is applied to the input of comparator 20. As soon as clock pulse $CLK'_1$ is applied to the input of gate $A_2$, the second step $(ST_2)$ of the conversion cycle is started. Flip-flop $FF_2$ is reset ($k'_2=0$). The result of the comparison of $\bar{X}_{(n)}^{(2)}$ with $X_{(n)}$ carried out in comparator 20, is applied to the input "S" (the so-called set input) of flip-flop $FF_1$. Such a flip-flop, therefore, is activated conditionally, which is schematically shown by CS, in the figure. The contents of flip-flop $FF_0$ is not modified, which is shown symbolically by X, in FIG. 5. The above-disclosed procedure is carried on step by step owing to the clock pulse successively scanning the inputs of gates $A_0, A_1, \ldots, A_{N-1}$.

At the end of the conversion cycle, the value of the searched rounded-off expression of sample $X_{(n)}$, a rounded-off value designated by $X'_{(n)}$, is available in register ADC REG. The output register, then, contains a bit, the so-called sign bit, in $FF_0$, and the other significant (N−1) bits, in flip-flops $FF_1$, through $FF_{N-1}$. The end of the conversion cycle is signalled upon occurrence of a logic level equal to "0" at the output of a circuit $\overline{A}$ carrying out the logic combination $\overline{AND}$ between $k_N$ and the clock pulse $CLK_N$.

While the invention has been particularly shown and described with reference to a preferred embodiment thereof, it will be understood by those skilled in the art that numerous changes in form and detail may be made therein without departing from the spirit and scope of this invention.

I claim:

1. An analog-to-digital converter for converting each sample of an analog signal into an N bit long rounded-off digital value expressed in two's complement code by means of a dichotomous process, said converter including:
    a two-input comparator the first input of which is fed with the sample of the signal to be digitally converted;
    a logic device connected to said comparator and providing an (N+1) bits long word;
    a digital-to-analog converter connected to said logic device and converting said (N+1) bit long word into an analog value which analog value is applied to the second input of said converter;
    said logic device including, initiating means for initially forcing each of the (N+1) bits produced by the logic device to the binary "1" value and second means for initiating an N step sequential operation of the logic device, in which the output of the logic device in sequence starting with the highest order bit first is conditionally determined based on the value provided by the comparator while The immediately adjacent lower order bit provided by the logic device is unconditionally forced to a binary "0" value and each of said conditionally determined bits remains unchanged for the remainder of the N step sequence; and,
    means for taking the N most significant bits obtained at the output of said logic device, at the end of the N steps long conversion process.

2. An analog-to-digital converter according to claim 1, wherein said logic device includes:
    N two-input AND logic circuits, one of the inputs of which is connected to the comparator output;
    an output register comprised of N flip-flop circuits one input of which is connected to the output of one of the AND logic circuits, the output of which is connected to the input of the digital-to-analog converter;
    means for forcing one of the inputs of the digital-to-analog converter to binary value "1"; and,
    clock means adapted to successively scan the second inputs of said N AND logic circuits while resetting successively and unconditionally all but one of the flip-flop circuits.

3. An analog-to-digital converter according to claim 1, wherein said logic device includes:
    N two-input AND logic circuits, one input of which is connected to the output of the comparator, the other inputs thereof being connected to the so-called clock inputs, respectively;
    an output register comprised of N bistable flip-flop circuits adapted to contain the sign bit and the other (N−1) significant bits of the final rounded-off coded value at the Nth step of the converting procedure, each of said flip-flop circuits having a set input (S) and a reset input (R);
    said initiating means being connected to the (S) inputs of said flip-flop circuits, said connections being made directly, for the sign flip-flop, and through an OR logic circuit, for the other (N−1) flip-flop circuits;
    means for connecting the input (R) of the sign flip-flop to the output of one of said AND logic circuits;
    means for connecting the output of each of the other AND logic circuits to the input of one of said OR logic circuits;
    means for connecting each of the so-called (R) inputs of the output register flip-flop circuits to one of said so-called clock inputs;
    means for connecting the normal outputs of the output register flip-flop circuits to the input of the digital-to-analog converter each of said flip-flop circuits supplying a bit of the word to be converted into said digital-to-analog converter; and,
    means for supplying the lowest weighted bit of the word at the input of the digital-to-analog converter, and for forcing said lowest weighted bit to the binary value "1".

* * * * *